(12) United States Patent
Murayama (10) Patent No.: US 6,301,314 B1
(45) Date of Patent: Oct. 9, 2001

(54) VITERBI DECODING APPARATUS AND VITERBI DECODING METHOD

(75) Inventor: Jun Murayama, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/091,793

(22) PCT Filed: Oct. 23, 1997

(86) PCT No.: PCT/JP97/03858

§ 371 Date: Jun. 23, 1998

§ 102(e) Date: Jun. 23, 1998

(87) PCT Pub. No.: WO98/18209

PCT Pub. Date: Apr. 30, 1998

(30) Foreign Application Priority Data

Oct. 24, 1996 (JP) ................................................ 8-282751

(51) Int. Cl.[7] .............................. H03D 1/00; H04L 27/06
(52) U.S. Cl. ........................... 375/341; 714/794; 714/795
(58) Field of Search ................................. 375/262, 316, 375/340, 341, 226; 714/794, 795

(56) References Cited

U.S. PATENT DOCUMENTS

| | | | | |
|---|---|---|---|---|
| 4,802,174 | * | 1/1989 | Hiraiwa et al. | 714/789 |
| 5,291,524 | * | 3/1994 | Itakura et al. | 375/341 |
| 5,295,142 | * | 3/1994 | Hatakeyama | 714/794 |
| 5,410,555 | * | 4/1995 | Itakura et al. | 714/795 |
| 5,418,795 | * | 5/1995 | Itakura et al. | 714/746 |
| 6,031,876 | * | 2/2000 | Oh et al. | 375/265 |

FOREIGN PATENT DOCUMENTS

| | | | |
|---|---|---|---|
| 61-161027 | 7/1986 | (JP) | H03M/13/12 |
| 4-20530 | 4/1992 | (JP) | H03M/13/12 |
| 6-204897 | 7/1994 | (JP) | H03M/13/12 |

OTHER PUBLICATIONS

A. Viterbi et al., "Principles of Digital Communication and Coding," McGraw–Hill, 1979, p. 259, Line 36 Through p. 260, Line 20.

* cited by examiner

Primary Examiner—Stephen Chin
Assistant Examiner—Lenny Jiang
(74) Attorney, Agent, or Firm—Limbach & Limbach L.L.P.

(57) ABSTRACT

Branch metric is calculated by a branch metric calculating circuit 21 on the basis of an input signal. ACS processing to select path of high likelihood on the basis of the branch metric to output state metric is carried out by an ACS circuit 22. Select information obtained by this ACS processing is stored into a path memory circuit 25. Normalization processing of all state metrics are carried out by a normalization circuit 23 on the basis of whether or not only one state metric outputted by the ACS processing is a set value determined in advance. The normalized state metrics are stored into a state metric memory circuit 24. Maximum likelihood decoding judgment processing for selecting maximum likelihood path is carried out by a maximum likelihood decoding judgment circuit 26 on the basis of select information stored in the path memory circuit 25. Thus, the circuit scale of the normalization circuit for carrying out normalization of state metrics is reduced, and high speed Viterbi decoding operation is realized.

12 Claims, 12 Drawing Sheets

VITERBI DECODING APPARATUS AND VITERBI DECODING METHOD

TECHNICAL FIELD

This invention relates to a Viterbi decoding apparatus and a Viterbi decoding method used in maximum likelihood decoding of convolution codes, and more particularly to a Viterbi decoding apparatus and a Viterbi decoding method in which the circuit scale of normalization circuit which carries out normalization of a state metric has been reduced and high speed decoding operation has been realized.

BACKGROUND ART

Hitherto, as one of systems of decoding convolution codes, Viterbi decoding system is known. This Viterbi decoding system is the maximum likelihood decoding system with respect to convolution codes, and is adapted to select series nearest to received code series (This series will be called the maximum likelihood path hereinafter) from code series which can be generated from encoder of the transmitting side to thereby carry out error correction.

In the Viterbi decoding apparatus, when data received through transmission path from the transmitting side is inputted, series nearest to received code series (maximum likelihood path) is selected from code series which can be generated from encoder of the transmitting side to generate decode data on the basis of this selected content. Namely, in the Viterbi decoding apparatus, when received data is inputted, branch metric of this received data is calculated by branch metric calculating circuit to deliver this calculated result (branch metric) to ACS (Add Compare Select) circuit. Further, the ACS circuit adds and compares Hamming distance (branch metric) between receive signal and path and state metric of branch metrics until that time with respect to respective two paths caused to flow together to a certain state on the basis of branch metric delivered from the branch metric calculating circuit and state metric (accumulated sum) delivered from state metric memory circuit to select state metric of high likelihood on the basis of this comparison result to deliver this selected content to path memory circuit, and to deliver state metric newly obtained to normalization circuit.

Figure 1:
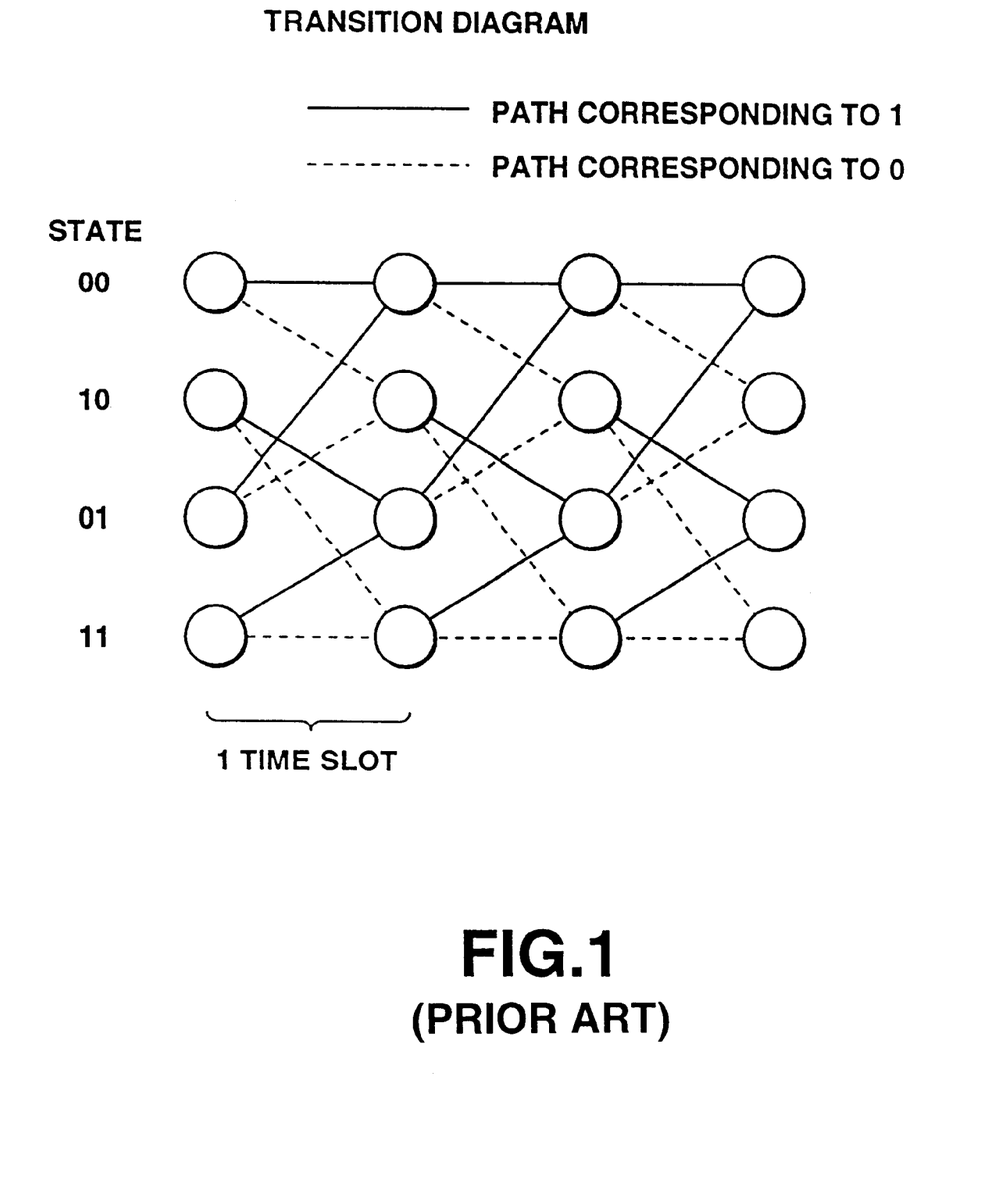
FIG. 1 is an explanatory view showing an example of transition diagram in the Viterbi decoding.

In this case, FIG. 1 is an explanatory view showing an example of transition diagram in the Viterbi decoding. In the case where constraint length is "3", branch metric between receive signal and path and state metric of branch metrics until that time are added and compared with respect to respective two paths caused to flow together to a certain state every respective time slots. Thus, state metric of the high likelihood is selected on the basis of this comparison result.

The normalization circuit normalizes state metric outputted from the ACS circuit to allow it to be value within the range set in advance to deliver it to a state metric memory circuit. The state metric memory circuit stores the normalized state metric delivered from the normalization circuit to feed it back to the ACS circuit. Moreover, the path memory circuit stores selected content outputted from the ACS circuit to deliver it to maximum likelihood decoding judgment circuit. The maximum likelihood decoding judgment circuit judges the maximum likelihood path on the basis of the selected content stored in the path memory circuit to generate decode data to output the decode data thus generated.

Figure 2:
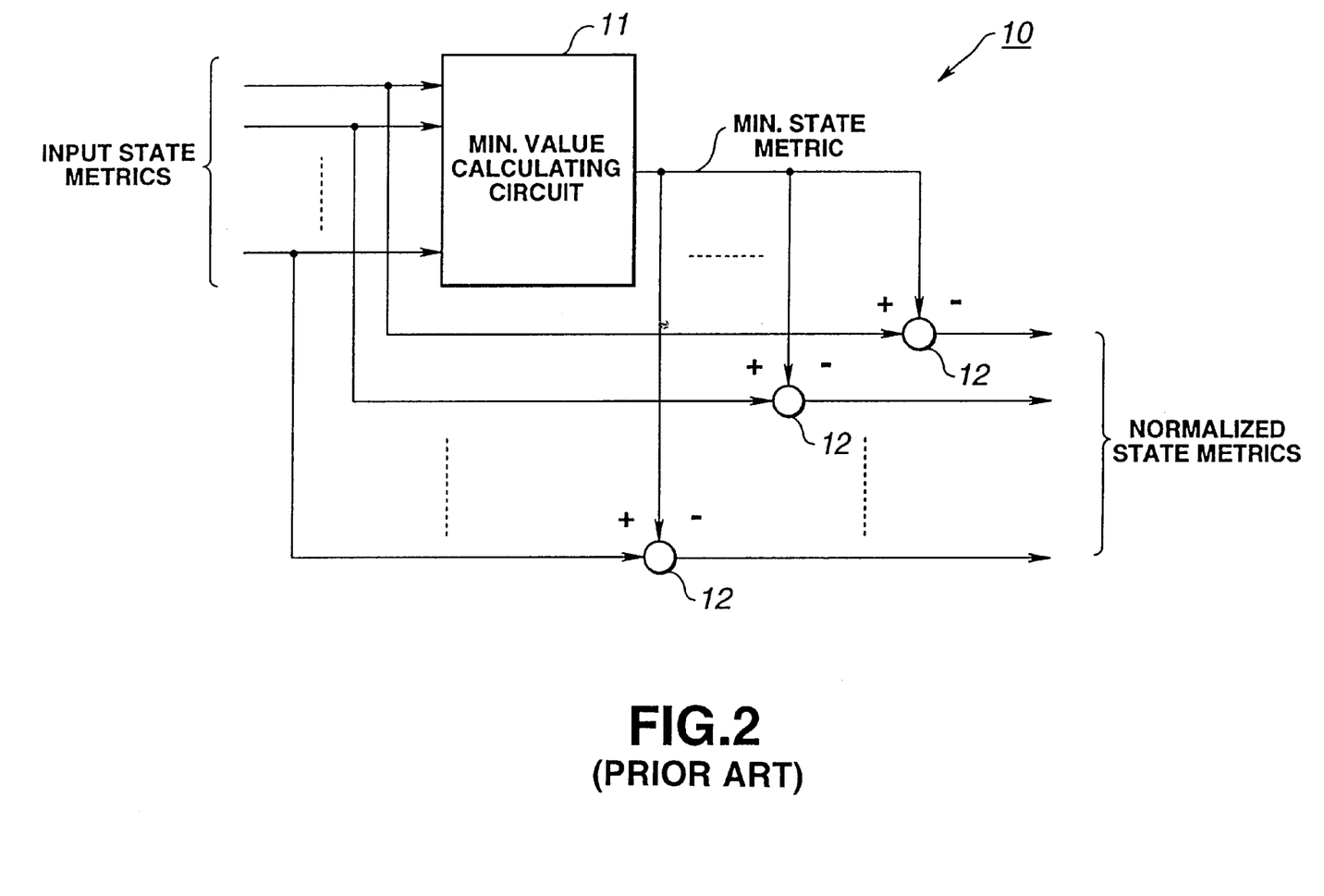
FIG. 2 is a block diagram showing an example of the configuration of a normalization circuit in a conventional Viterbi decoding apparatus.

In the conventional Viterbi decoding apparatus, there was used a normalization circuit 10 of a configuration as shown in FIG. 2, for example. This normalization circuit 10 is composed of a minimum value calculating circuit 11, and plural subtracting circuits 12. The minimum value calculating circuit 11 is supplied with state metrics corresponding to the number of states. The minimum value calculating circuit 11 calculates minimum value of all state metrics inputted thereto to output the minimum state metric. The respective subtracting circuits 12 subtract the minimum state metric from respective input state metrics to respectively output the subtraction results as normalized state metrics.

Meanwhile, in such a Viterbi decoding apparatus, an approach is employed in the normalization circuit to determine the minimum value from all state metrics sent from the ACS circuit to output the determined minimum value as correction value to subtract this correction value from respective state metrics to thereby carry out normalization thus to obtain normalized state metrics.

In general, in the Viterbi decoding, in order to enhance the error correction ability, constraint length K of code is caused to be large. With respect to the constraint length K of code, the number of states becomes equal to $2^{k-1}$. For this reason, in the normalization circuit, processing for calculating the minimum value from $2^{k-1}$ number of state metrics every time slot is required.

Implementation of time required processing which detects the minimum value from $2^{k-1}$ number of state metrics in the feedback loop returning to the ACS circuit via the normalization circuit and the state metric memory circuit from the ACS circuit lowers operation speed of the entirety of the Viterbi decoding apparatus.

Moreover, since the normalization processing is carried out by subtraction between corresponding state metric and the minimum value of the state metrics, in the case where the constraint length K is caused to be large, $2^{k-1}$ number of subtracting circuits 12 are required in the above-mentioned normalization circuit 10. As a result, the circuit scale is increased.

This invention has been made for the purpose of solving the above-described problems, and its object is to provide a Viterbi decoding apparatus having small circuit scale and capable of carrying out high speed operation. In addition, this invention has been made for the purpose of solving the above-described problems, and its object is to provide a Viterbi decoding method which permits reduction in the circuit scale and high speed operation.

DISCLOSURE OF THE INVENTION

Figure 3:
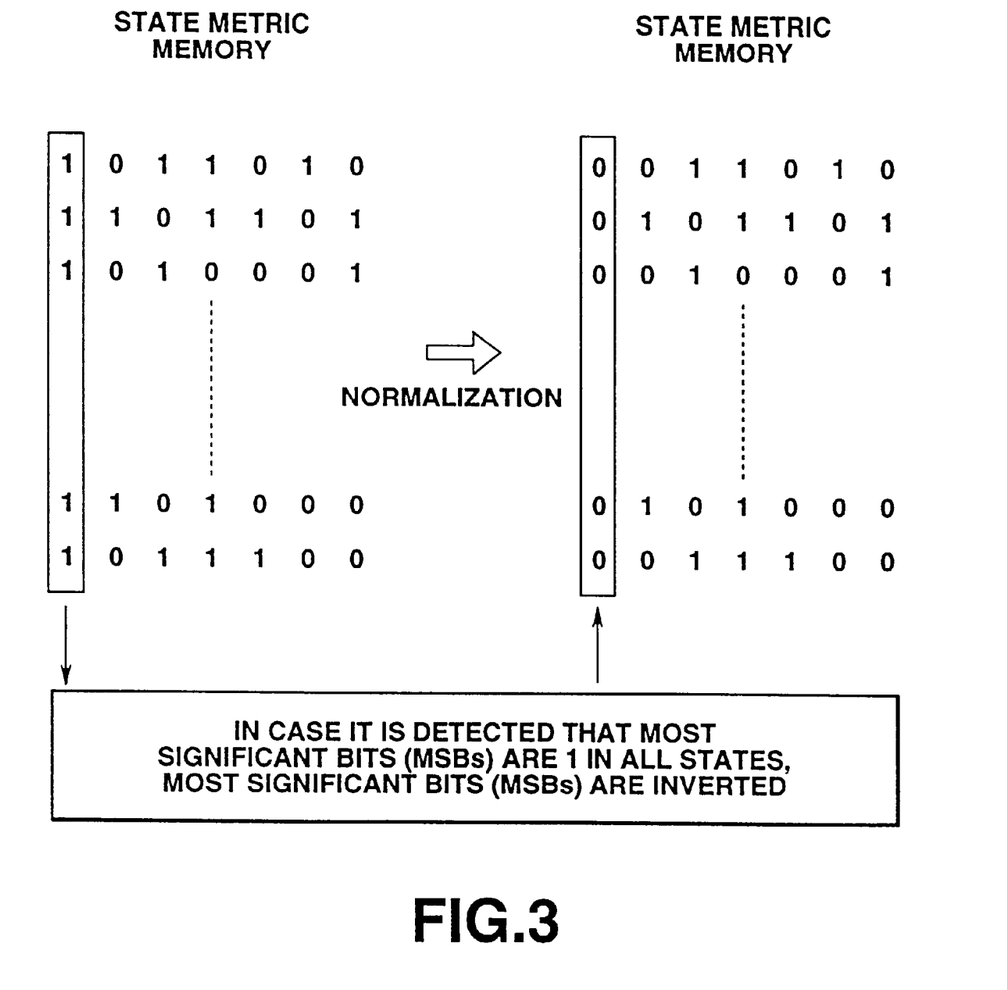
FIG. 3 is an explanatory view of normalization processing for inverting Most Significant Bits in the case where Most Significant Bits of state metrics are at logic "1" level in all states.

FIG. 3 is an explanatory view of normalization processing for inverting Most Significant Bits (MSBs) in the case where the Most Significant Bits of state metrics are at logic "1" level in all states. It can be detected by using logical product circuit having inputs corresponding to the number of states that Most Significant Bits (MSBs) of state metrics are at logic "1" level in all states. Further, the system of inverting Most Significant Bit (MSB) to thereby carry out normalization processing is simple in the configuration, and is easy in the normalization processing.

Figure 4:
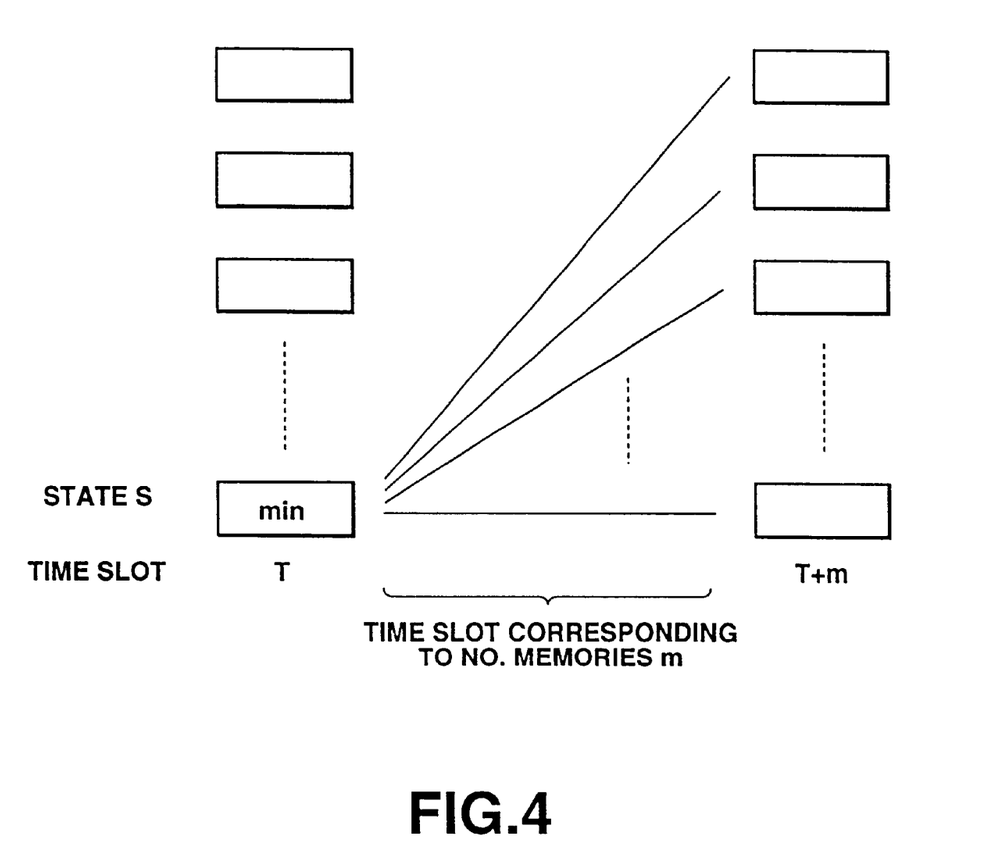
FIG. 4 is an explanatory view showing the property of state metric.

The property of the state metric will now be described with reference to FIG. 4. In the FIG. 4 mentioned above, at a certain time slot, state in which the state metric becomes minimum among all states is assumed to be S. Further, when the state transition is advanced (time is passed) by time slot corresponding to the number of memories m, paths arriving from the previous state S to all states at the current time point are opened (formed). By the algorithm to select smaller one of metrics of the Viterbi decoding apparatus, metric values stored in the path memory circuit are metric values of paths passing from the state S or values smaller than the former at the time slot T+m.

Assuming now that the metric value of the state S at the time slot T is min, and width of (total) value of metrics added for a time period during which the state transition is advanced (time is passed) by time slot corresponding to the number of memories m is 0~Bmax, state metric values of all states at the time slot T+m are caused to fall within the range from min to min+Bmax. Namely, the state metric value at a certain time slot always falls within the width of Bmax.

In the case where state metric V of one state is taken out at a certain time slot to consider the relationship between this state metric V and the other state metric at the same time slot, since the state metric value is caused to always fall within the width Bmax, the following matter can be said.

When state metric of a certain state is V and state metric of the other state is V', the following relationship holds:

$$V-B\max \leq V' \leq V+B\max$$

Namely, when state metric V of one state is considered at a certain time slot, it is seen that state metric of other state falls within V±Bmax.

In this invention, this property is used for detecting that Most Significant Bits (MSBs) of plural state metrics stored in the state metric memory circuit are at all logic "1" level.

When the state metric memory circuit is assumed to have n bits, the value that Most Significant Bit (MSB) represents becomes equal to $2^{n-1}$. In this case, it can be said that when $V \geq 2^{n-1}+B\max$ holds in the case where a certain state metric V is taken, other state metric V' falls, from the property of the previously described state metric, within V±Bmax, i.e., is expressed as follows:

$$V-B\max \leq V' \leq V+B\max$$

therefore $2^{n-1} \leq V'$ holds. This indicates that values of all state metrics are $2^{n-1}$ or more, i.e., Most Significant Bits (MSBs) are at logic "1" level.

Thus, it is seen that normalization processing is required by detecting the state where state metric of a certain one state is $2^{n-1}+B\max$ or more.

Accordingly, the system of detecting that normalization processing is required by indicating that Most Significant Bits of state metrics are at logic "1" level in all states (by taking logical product of Most Significant Bits (MSBs) of all state metrics) may be replaced by the system of detecting the state where state metric of one state is $2^{n-1}+B\max$ or more.

Let now consider memory size of the state metric memory circuit. There are following three conditions as the condition on this premise.

(Condition 1) Width of metric(s) added for one time slot: 0~b (Condition 2) Width of metric(s) added for time slot corresponding to the number of memories m: 0~B max (Condition 3) Normalization is carried out when it is detected that several (1 to all) states are predetermined value M or more.

Way of thinking is as follows.

(1) It is assumed to be detected that normalization is required at a certain time slot.

(2) At time earlier by one time slot, at least one metric value of states which have been monitored is ought to all have fallen within the range from M−b to M−1.

(3) It is considered that the metric value of state which took value within the range from m−b to M−1 at time earlier by one time slot became value between M and M−1+b as the result of the fact that value ranging from 0 to b is added for one time slot.

(4) Maximum value of metric of other state at this time is value obtained by further adding Bmax to M−1+b, i.e., value of M−1+b+Bmax or less.

(5) Thus, in order not to allow overflow to take place, it is necessary that memory size of the state metric memory circuit (state metric memory) is M−1+b+Bmax or more.

Let now consider which size (number of bits) of path memory is required in three systems of the system of taking logical product of Most Significant Bits (MSBs) of all state metrics, the system of detecting the state where state metric of one state is $2^{n-}+B\max$ or more, and the conventional minimum value detection system.

(System 1) The system of taking logical product of Most Significant Bits of all state metrics.

When the state metric memory is assumed to have n bits, this system 1 corresponds to recognition of the fact that metric values stored in all state metric memories are $2^{n-1}$ or more.

In the case where it is assumed that this detection system is carried out every respective time slots, width of value of metric(s) added for one time slot is 0~b, and width of value of metric(s) added for time slot corresponding to the number of memories is 0~Bmax, let consider what width of value the minimum metric value at the time slot in which it has been detected that normalization is required has.

Initially, at time by one time slot with respect to time slot in which it is detected that normalization is required, the Most Significant Bit (MSB) of at least one metric (value) stored within the state metric memories was not ought to be at logic "1" level. Further, it is considered that metric value falling within the range from 0 to b is added for one time slot as the result of the fact that it is detected that normalization is required, so Most Significant Bit (MSB) changes from logic "0" level to logic "1" level.

Thus, it is seen that value that metrics in which Most Significant Bits (MSBs) are at logic "0" level of the state metric memory at time by one time slot with respect to time slot in which it is detected that normalization is required has been $$2^{n-1}-b \sim 2^{n-1}-1$$

Because Most Significant Bit (MSB) takes logic "1" level as the result of the fact that metrics (metric values) of 0 to b are added for one time slot, the value that Most Significant Bit (MSB) takes when it is caused to be at logic "1" falls within the range expressed as follows:

$$2^{n-1} \sim 2^{n-1}-1+b$$

Namely, the minimum metric value in all state metric memories at the time slot in which it is detected that normalization is required falls within the rang e expressed as follows.

$$2^{n-1} \sim 2^{n-1}-1+b$$

Since it is already known from the property of state metric that the state metric value at a certain time slot always falls within the width Bmax, it is seen that the maximum value of metric values (state metrics) of all state metric memories falls within the range $2^{n-1}1+b+B\max$ in which Bmax is added to the maximum $2^{n-1}1-1+b$ of the minimum metric value. Namely, if the memory size of the state metric memory is the above-mentioned value or more, overflow does not take place.

Since the maximum value of the state metric memory is $2^{n-1}$, the necessary condition is as follows.

$$2^n-1 \geq 2^{n-1}-1+b+B\max$$

In this case, when arrangement is carried out with respect to the number of bits n of state metric memory by taking into consideration Bmax=b·m, the following relational expression is provided.

$$2^n - 2^{n-1} \geq b + b \cdot m$$

$$2^{n-1} \geq (m+1)b$$

$$n-1 \geq \log_2(m+1)b$$

$$n \geq \log_2(m+1)b+1$$

For example, in the DVB standard, since the number of memories m is 6 and the maximum metric b added for one time slot is 14 (7×2), the necessary number of bits n of the state metric memory is expressed as follows.

$$n \geq \log_2(6+1) \times 14+1$$

$$n \geq \log_2 98+1$$

$$n \geq 7.61$$

As a result, 8 bits are required.

(System 2) The system of detecting the state where state metric of one state is $2^{n-1}$+Bmax or more.

The value that metric (value) of remarked state takes at time earlier by one time slot with respect to time slot in which it is detected that normalization is required falls within the range expressed as follows.

$$2^{n-1}+B\text{max}-b \sim 2^{n-1}+B\text{max}-1$$

Since value becomes equal to $2^{n-1}$+B max or more as the result of the fact metrics of 0 to b are added for one time slot, value of metric at the time slot in which it is detected that normalization is required falls within the range expressed as follows.

$$2^{n-1}+B\text{max} \sim 2^{n-1}+B\text{max}-1+b$$

When consideration is made in connection with the maximum value of metric in other state at this time in order to determine the condition of memory size of the state metric memory, this maximum value is smaller than value obtained by adding Bmax to the metric value of the remarked state, which is expressed as follows:

$$2^{n-1}+B\text{max}-1+b+B\text{max}=2^{n-1}+2B\text{max}+b-1$$

Namely, if the memory size of the state metric memory is the above-mentioned value or more, overflow does not take place. Since the maximum value of the state metric memory is $2^n1$, the necessary condition is as follows.

$$2^n-1 \geq 2^{n-1} 2B\text{max} b+-1$$

In this case, when arrangement is made in connection with the number of bits of the state metric memory by taking Bmax=b·m into consideration, the following relational expression holds:

$$2^n - 2^{n-1} \geq 2 \times b \cdot m + b$$

$$2^{n-1} \geq (2m+1)b$$

$$n-1 \geq \log_2(2m+1)b$$

$$n \geq \log_2(2m+1)b+1$$

For example, in the DVB standard, since the number of memories m is 6 and the maximum metric b added for one time slot is 14 (7×2), the necessary number of bits n of the state metric memory is expressed as follows:

$$n \geq \log_2(2 \times 6+1) \times 14 +1$$

$$n \geq \log_2 182+1$$

$$n \geq 8.51$$

Thus, 9 bits are required.

(System 3) Conventional minimum value detection system (the system of detecting the minimum value of all state metric memories to subtract the detected minimum value to thereby carry out normalization).

At time earlier by one time slot with respect to the time slot in which normalization is carried out, there necessarily exists state having metric value 0 by the normalization processing of minimum value subtraction at time earlier by one time slot. The minimum metric when one time slot is passed from this time is smaller than value obtained by adding 0~b to the metric of the state which had the metric value 0 at time earlier by one time slot. Thus, it can be said that values exist within the range from 0 to b.

When consideration is made in connection with the maximum value of the metric in other state at this time in order to determine the condition of the memory size of the state metric memory, this maximum value is smaller than b+Bmax which is the maximum of value obtained by adding Bmax to the minimum value metric. Namely, if the memory size of the state metric memory is the above-mentioned value or more, overflow does not take place.

Since the maximum value of the state metric memory is $2^n-1$, the necessary condition is as follows:

$$2^n-1 \geq b+B\text{max}$$

In this instance, when arrangement is made in connection with the number of bits of the state metric memory by taking Bmax=b·m into consideration, the following relational expression holds:

$$2^n \geq b+b \cdot m+1$$

$$n \geq log_2\{(m+1)b+1\}$$

For example, in the DVB standard, since the number of memories m is 6 and the maximum metric added for one time slot is 14 (7×2), the necessary number of bits n of the state metric memory is expressed as follows:

$$n \geq \log_2\{(6+1) \times 14+1\}$$

$$n \geq \log_2 99$$

$$n \geq 6.63$$

Thus, 7 bits are required.

In this case, the numbers of bits n of state metric memories required in respective systems are arranged in the ascending order of the number of bits n.

(System 3) Conventional minimum value detection system $$n \geq log_2\{(m+1,\text{i } b+1\}$$

7 bits in DVB (System 1) The system of taking logical product of Most Significant Bits of all state metrics $$n \geq log_2(m+1)b+1$$

8 bits in DVB (System 2) The system of detecting the state where state metric of one state is $2^{n-1}+$Bmax or more (Alternative system of the system 1)

$$n \geq \log_2(2m+1)b+1$$

9 bits in DVB

Let now consider the system (alternative system) of detecting the state where state metric of one state is $2^{n-1}+$Bmax or more with respect to the normalization circuit in the standard of DVB. In the DVB standard, the number of memories m is 6 and the maximum value b of metric(s) added for one time slot is 14 (7×2), and the maximum value Bmax of metric(s) added for time slot corresponding to the number of memories is 84 (14×6).

Initially, as previously described, 9 bits are required as the number of bits of the state metric memory. The key point is a circuit for detecting that normalization is required. This circuit is constituted as a circuit for detecting that metric value of a certain state is $2^{n-}+$Bmax=256+84=340 or more.

As previously described, in the case where an approach is employed to detect that the value of a certain state is M or more to carry out normalization, the upper limit of other state metric values at that time is M−1+b+Bmax, i.e., M+97 in the case of DVB. Assuming now that M is 384, since 384≧340 holds, the setting of this M value is in correspondence with the condition required for permitting implementation of normalization. In addition, since M+97=481, the values of all metrics fall within a memory size $2^9-1=511$ of the state metric memory.

As stated above, it is already known that, in general, the value of a state metric at an arbitrary time slot can only fall within the range of a certain value B determined by the configuration of an encoder. Thus, when a value W to be subtracted by normalization is determined in advance, if it is only confirmed that the value of one state is B+W, it is known that the values of other all state metrics are W or more. Thus, normalization by subtracting W can be carried out. In this case, when W is set to a value easy to undergo subtraction, the configuration of the subtraction circuit can be simplified and the circuit scale can be thus reduced. For example, when W is set to a value corresponding to the Most Significant Bit of the state metric, it is sufficient to only carry out inverting of the Most Significant Bit as processing for subtracting W from the state metric.

In view of the above, in this invention, in order to solve the conventional problems, the property of the above-described state metric is utilized to carry out normalization of all state metrics by inverting of the Most Significant Bit or subtraction of a value determined in advance on the basis of whether only one state metric is a set value determined in advance or more in the normalization circuit for carrying out normalization of a state metric.

Namely, the Viterbi decoding apparatus according to this invention is directed to a Viterbi decoding apparatus including a branch metric calculating circuit for calculating branch metric on the basis of an input signal, an ACS circuit for selecting a path of high likelihood on the basis of the branch metric calculated at the branch metric calculating circuit to output a state metric, a path memory circuit for storing selected information obtained by the ACS circuit, a normalization circuit for normalizing the state metric outputted from the ACS circuit, a state metric memory circuit for storing the state metric normalized at the normalization circuit, and a maximum likelihood decoding judgment circuit for selecting the maximum likelihood path on the basis of the memory content of the path memory circuit, and serves to carry out, in the above-mentioned normalization circuit, normalization processing of all state metrics on the basis of whether or not only one state metric outputted from the ACS circuit is a set value determined in advance or more.

In the Viterbi decoding apparatus according to this invention, the normalization circuit carries out judgment as to whether or not a state metric is a set value determined in advance or more in carrying out normalization processing of all state metrics, e.g., by taking a logical product of a Most Significant Bit and several bits of lower order with respect to the Most Significant Bit of the state metric.

Moreover, in the Viterbi decoding apparatus according to this invention, the above-mentioned normalization circuit carries out the above-mentioned normalization processing, e.g., by inverting the Most Significant Bits of all state metrics.

Further, in the Viterbi decoding apparatus according to this invention, the normalization circuit carries out the above-mentioned normalization processing, e.g., by subtracting a value determined in advance from all state metrics.

Further, in the Viterbi decoding apparatus according to this invention, the above-mentioned normalization circuit carries out judgment as to whether or not the state metric is a set value determined in advance or more in carrying out the normalization processing, e.g., by taking a logical sum of a Most Significant Bit and several bits of lower order with respect to the Most Significant Bit of the state metric.

In addition, in the Viterbi decoding apparatus according to this invention, the normalization circuit carries out the above-mentioned normalization processing by subtracting a value determined in advance from all state metrics.

As stated above, by two simple processes of the processing for judging whether or not only one state metric is a set value determined in advance or more and the normalization processing by inverting of a Most Significant Bit or subtraction of a value determined in advance, the normalization processing can be carried out. As compared to the configuration in which the minimum value detection processing and the processing for subtracting a detected minimum value are combined as in the case of the normalization circuit of the conventional Viterbi decoding apparatus, the Viterbi decoding apparatus according to this invention can reduce the circuit scale and carry out high speed operation.

Further, a Viterbi decoding method according to this invention comprises the steps of: calculating a branch metric on the basis of an input signal; carrying out ACS processing to select a path of high likelihood on the basis of the branch metric to output a state metric; storing selected path information obtained by the ACS processing, carrying out normalization processing of all state metrics on the basis of whether or not only one state metric outputted by the ACS processing is a set value determined in advance or more; storing the normalized state metric; and carrying out maximum likelihood decoding judgment processing to select the maximum likelihood path on the basis of the stored selected path information.

In the Viterbi decoding method according to this invention, e.g., a logical product of a Most Significant Bit and several bits of lower order with respect to the Most Significant Bit of the state metric is taken to thereby carry out judgment as to whether or not one state metric is a set value or more in carrying out the normalization processing.

Further, in the Viterbi decoding method according to this invention, e.g., all Most Significant Bits of state metrics are inverted to thereby carry out the above-mentioned normalization processing.

Further, in the Viterbi decoding method according to this invention, e.g., a value determined in advance is subtracted from all state metrics to thereby carry out the above-mentioned normalization processing.

Further, in the Viterbi decoding method according to this invention, e.g., a logical sum of a Most Significant Bit and several bits of lower order with respect to the Most Significant Bit of a state metric is taken to thereby carry out judgment as to whether or not one state metric is a set value determined in advance or more in carrying out the above-mentioned normalization processing.

In addition, in the Viterbi decoding method according to this invention, e.g., a value determined in advance is subtracted from all state metrics to thereby carry out the above-mentioned normalization processing.

BEST MODE FOR CARRYING OUT THE INVENTION

Best mode for carrying out this invention will be described below in detail with reference to the attached drawings.

Figure 5:
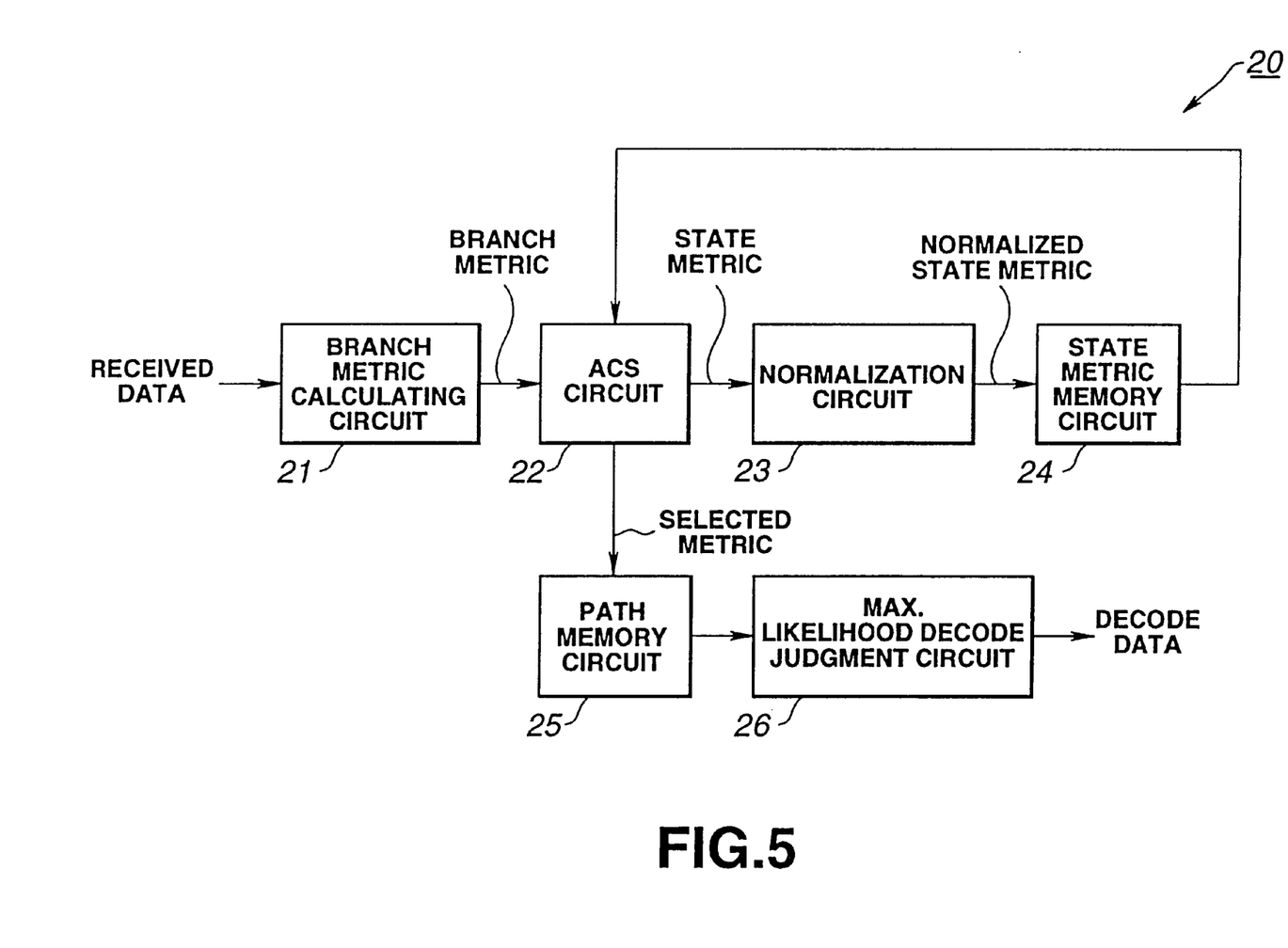
FIG. 5 is a block diagram showing an example of the configuration of a Viterbi decoding apparatus according to this invention.

A Viterbi decoding apparatus (unit) according to this invention is constituted as shown in FIG. 5, for example. The Viterbi decoding unit shown in FIG. 5 comprises a branch metric calculating circuit 21, an ACS (Add Compare Select) circuit 22, a normalization circuit 23, a state metric memory circuit 24, a path memory circuit 25, and a maximum likelihood decoding (decode) judgment circuit 26.

Figure 6:
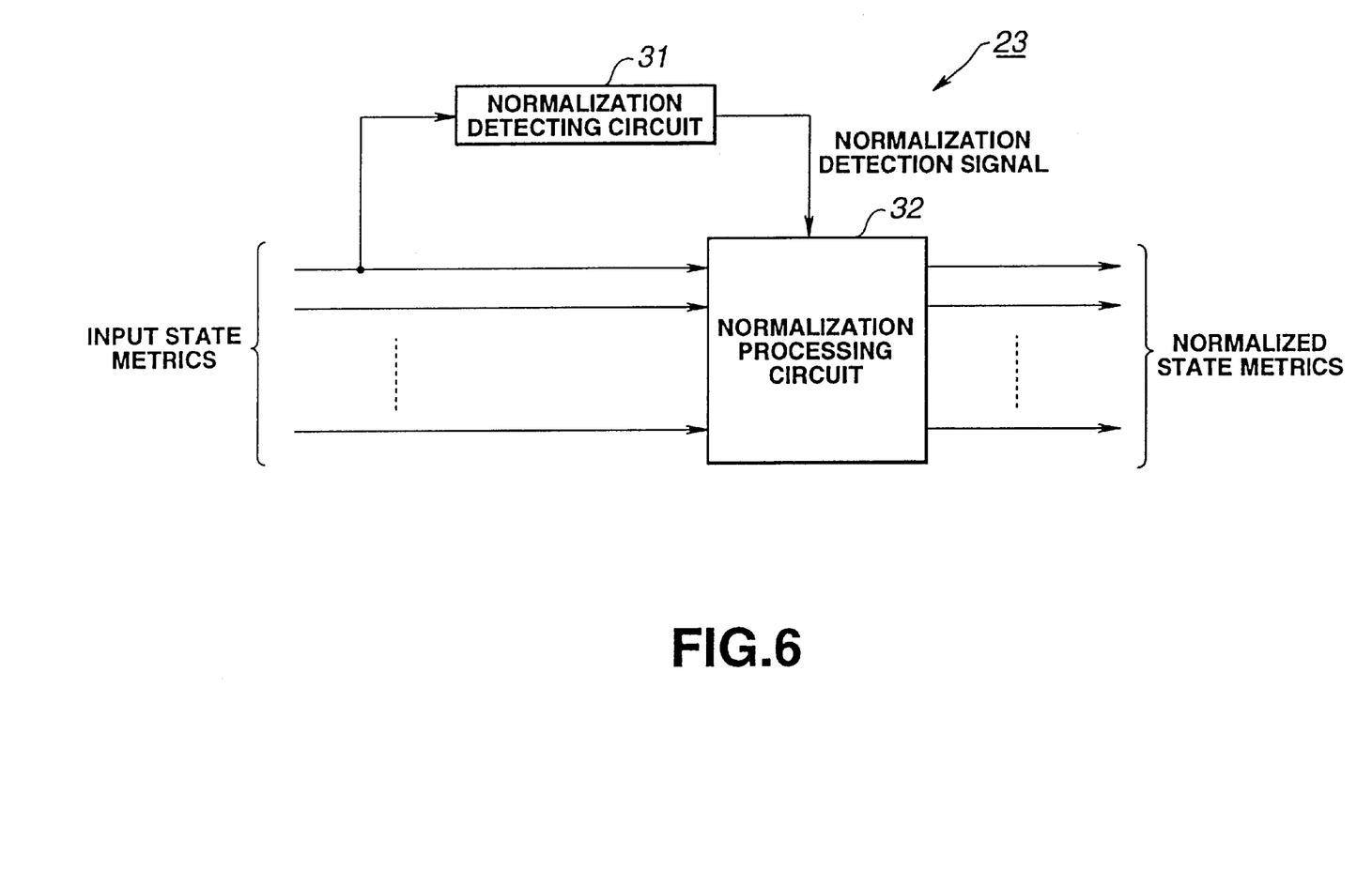
FIG. 6 is a block diagram showing an example of the configuration of a normalization circuit in the Viterbi decoding apparatus according to this invention.

The normalization circuit 23 is composed, as shown in FIG. 6, of a normalization detecting circuit 31, and a normalization processing circuit 32.

The normalization detecting circuit 31 is supplied with one state metric of input state metrics to judge whether or not that state metric is a set value W determined in advance or more. The normalization detecting circuit 31 is operative so that in the case where the input state metric is set value W or more, it provides output of logic "1" level as a normalization detection signal, and in the case where otherwise, it provides output of logic "0" level. Moreover, the normalization processing circuit 32 is operative so that in the case where normalization detection signal is at logic "0" level, it outputs input state metrics as normalized state metrics as they are, and in the case where the normalization detection signal is at logic "1" level, it carries out normalization processing by inverting of Most Significant Bit or subtraction of value determined in advance to output normalized state metrics.

Figure 7:
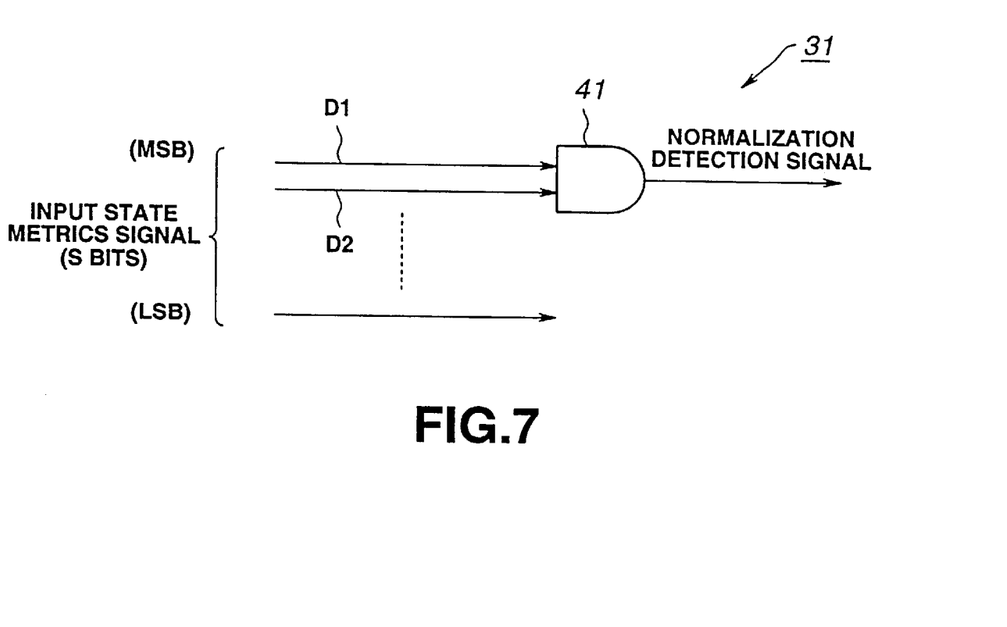
FIG. 7 is a circuit diagram showing a first example of the configuration of normalization detecting circuit.

FIG. 7 is a circuit diagram showing a first example of the configuration of the normalization detecting circuit 31. Logical product of Most Significant Bit signal D1 and signal D2 of bit lower by one with respect to the Most Significant Bit (MSB) of inputted one state metric signal s bits is taken by a logical product circuit 41. Thus, logical product output is provided as normalization detection signal. By this configuration, when state metric is value of $2^{s-1}+2^{s-2}$ or more, output of logic "1" level is provided as a normalization detection signal.

Figure 8:
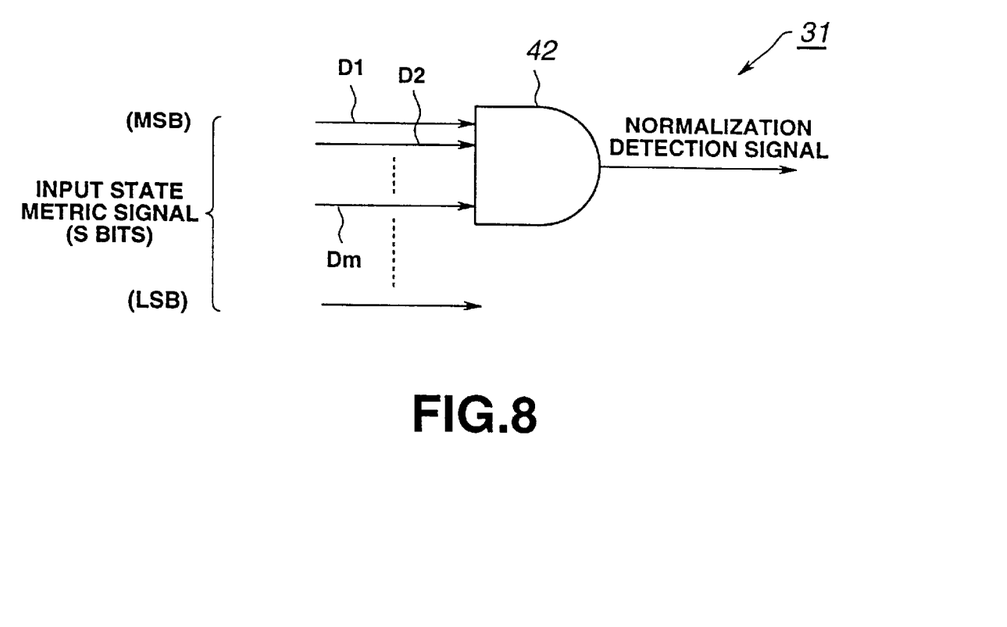
FIG. 8 is a circuit diagram showing a second example of the configuration of the normalization detecting circuit.

FIG. 8 is a circuit diagram showing a second example of the configuration of the normalization detecting circuit 31. Logical product of signals D1~Dm of m bits in total of Most Significant Bit signal D1 and bits of lower order with respect to the Most Significant Bit (MSB) of inputted one state metric signal s bits is taken by a logical product circuit 42. Thus, logical product output is outputted as a normalization detection signal. By this configuration, when state metric is value of $2^{s-1}2^{s-2}30 \ldots +2^{s-m}$ or more, output of logic "1" level is provided as a normalization detection signal.

Figure 9:
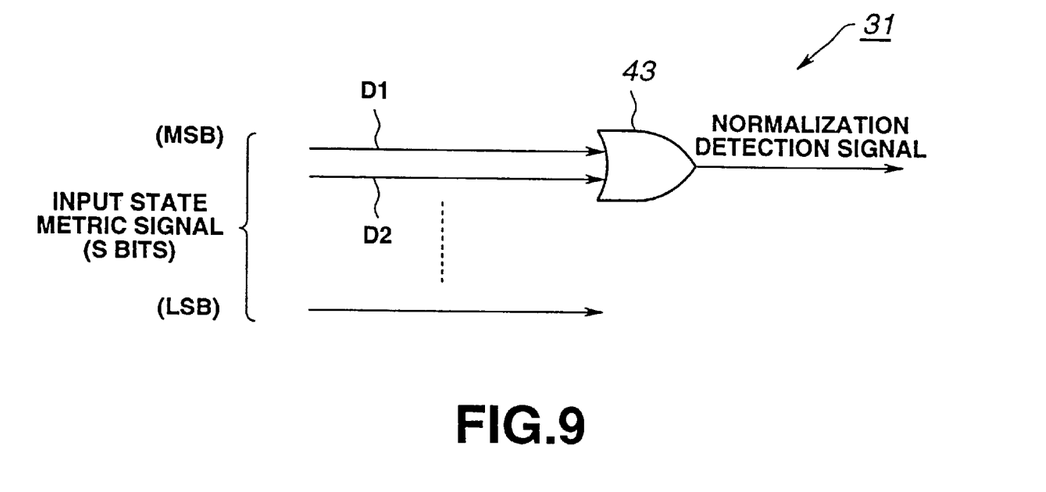
FIG. 9 is a circuit diagram showing a third example of the configuration of the normalization detecting circuit.

FIG. 9 is a circuit diagram showing a third example of the configuration of the normalization detecting circuit 31. Logical sum of Most Significant Bit signal D1 and signal D2 lower by one with respect to the Most Significant Bit (MSB) of inputted one state metric signal s bits is taken by a logical sum circuit 43. Thus, logical sum output is outputted as a normalization detection signal. By this configuration, when state metric is value of $2^{s-2}$ or more, output of logic "1" level is provided as a normalization detection signal.

Figure 10:
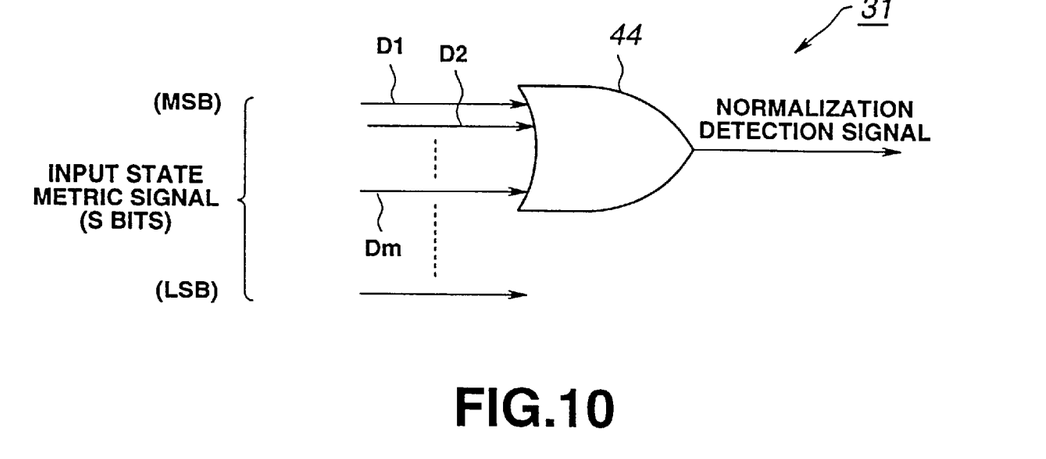
FIG. 10 is a circuit diagram showing a forth example of the configuration of the normalization detecting circuit.

FIG. 10 is a circuit diagram showing a fourth example of the configuration of the normalization detecting circuit 31. Logical sum of signals D1~Dm of m bits in total of Most Significant Bit and bits of lower order with respect to the Most Significant Bit (MSB) of inputted one state metric signal s bits is taken by a logical sum circuit 44. Thus, logical sum output is outputted as a normalization detection signal. By this configuration, when state metric is value of $2^{s-m}$ or more, output of logic "1" level is provided as a normalization detection signal.

Figure 11:
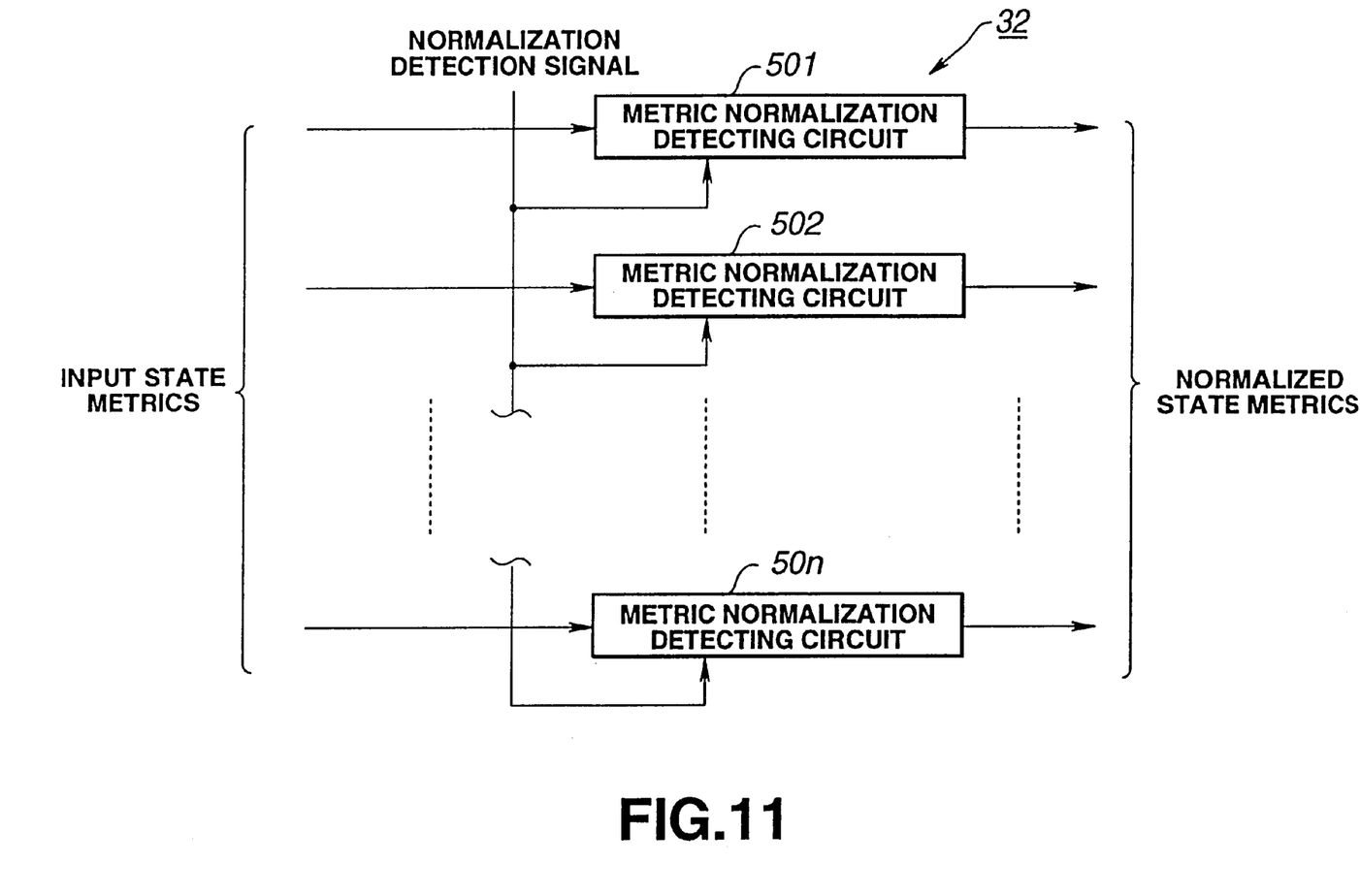
FIG. 11 is a block diagram showing an example of the configuration of normalization processing circuit.

FIG. 11 is a block diagram of the normalization processing circuit 32. Inputted state metrics are normalized by metric normalization circuits 501~50n which carry out normalization on the basis of normalization detection signal, and are outputted as normalized state metrics.

Figure 12:
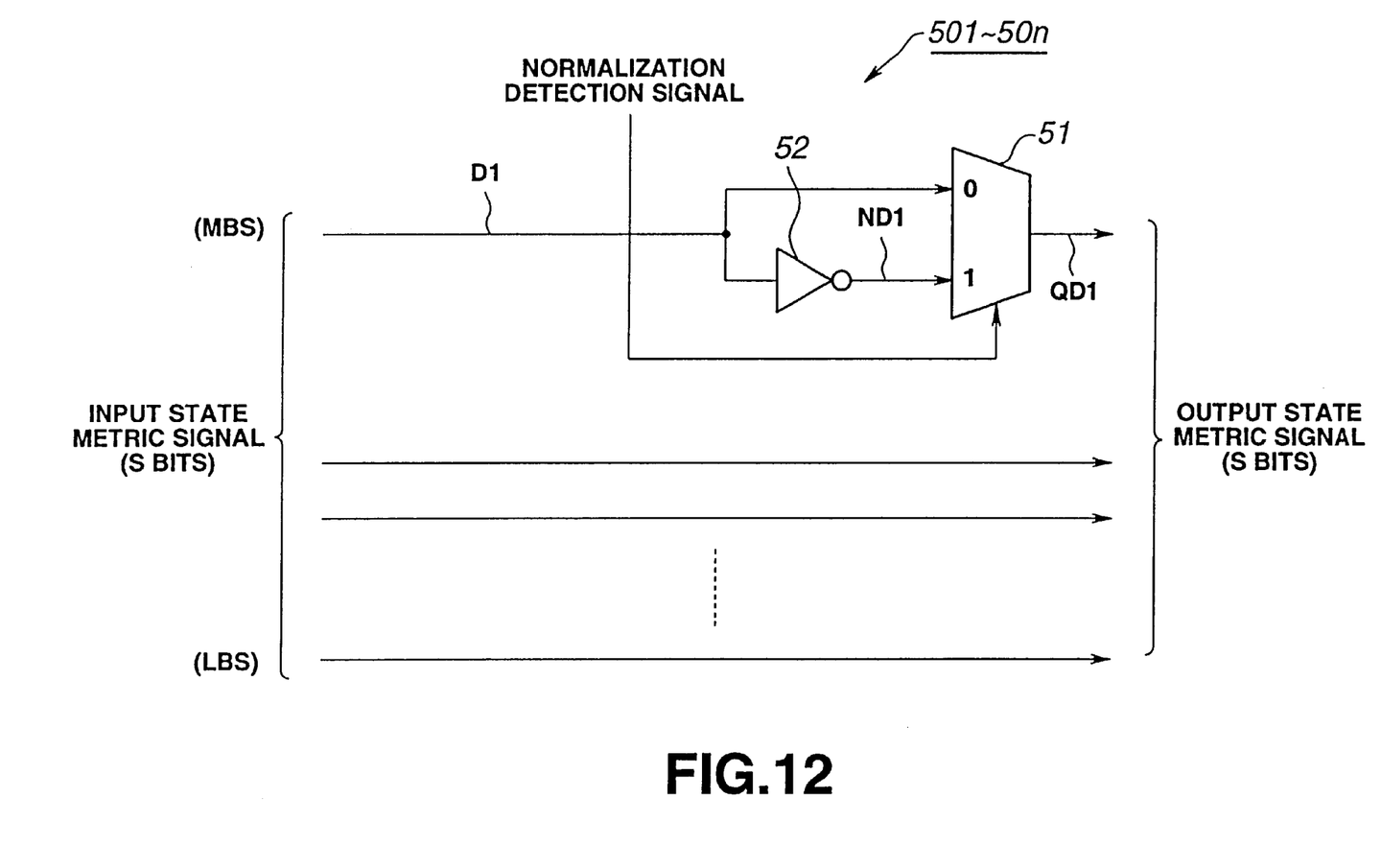
FIG. 12 is a circuit diagram showing a first example of the configuration of metric normalization circuit.

FIG. 12 is a circuit diagram showing a first example of the configuration of metric normalization circuits 501 to 50n. A select circuit 51 is operative so that in the case where the normalization detection signal is at logic "0" level, it outputs Most Significant Bit signal D1 as a normalized Most Significant Bit signal QD1 as it is, and in the case where the normalization detection signal is at logic "1" level, it outputs inverted Most Significant Bit signal ND1 inverted by an inverting circuit 52 as a normalized Most Significant Bit signal QD1.

The metric normalization circuits 501~50n shown in FIG. 12 output, as normalized state metric signal, combination of s−1 bits of lower order with respect to Most Significant Bit (MSB) and normalized Most Significant Bit signal QD1 of input state metric signal s bits. In the case where the normalization detection signal is at logic "1" level, processing carried out at the metric normalization circuits 501~50n shown in FIG. 8 correspond to implementation of subtraction of $2^{s-1}$ from the state metrics.

Figure 13:
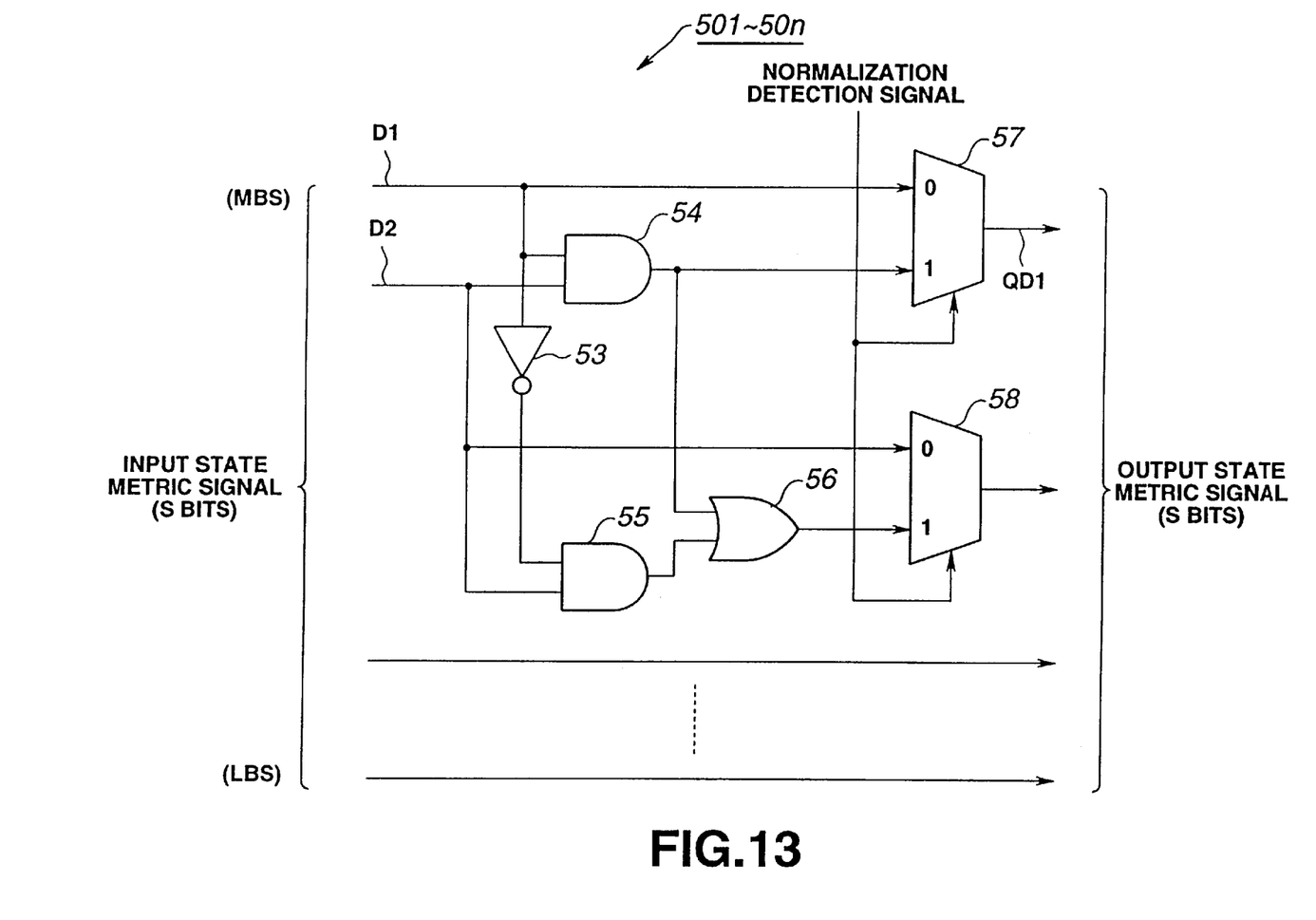
FIG. 13 is a circuit diagram showing a second example of the configuration of the metric normalization circuit.

FIG. 13 is a circuit diagram showing a second example of the configuration of metric normalization circuits 501~50n. Normalization of Most Significant Bit signal D1 and signal D2 of 1 bit of lower order with respect to the Most Significant Bit (MSB) of inputted state metric is carried out by logic circuit composed of an inverting circuit 53, two logical product circuits 54, 55, a logical sum circuit 56, and two select circuits 57, 58, and is outputted as a normalized state metric signal in combination with s−2 bits of lower order.

The first logical product circuit 54 takes logical product of Most Significant Bit signal D1 and signal D2 of 1 bit of lower order with respect to the Most Significant Bit (MSB) to output it. Logical product output of the first logical product circuit 54 is delivered to the other input terminal (terminal labeled 1) of the first selector circuit, and is delivered to one input terminal of the logical sum circuit 56. The inverting circuit 53 inverts the Most Significant Bit signal D1 to deliver inverted Most Significant Bit signal to one input terminal of the second logical product circuit 55. The second logical product circuit 55 takes logical product of the inverted Most Significant Bit signal and the signal D2 of 1 bit of lower order with respect to the Most Significant Bit (MSB) to deliver logical product output to the other input terminal of the logical sum circuit 56. Logical sum output of the logical sum circuit 56 is delivered to the other input terminal (terminal labeled 1) of the second selector circuit 58. One input terminal (terminal labeled 0) of the first selector circuit 57 is supplied with the Most Significant Bit signal D1. One input terminal (terminal labeled 0) of the second selector circuit 58 is supplied with the signal D2 of 1 bit of lower order with respect to the Most Significant Bit (MSB).

The respective selector circuits 57, 58 are operative so that in the case where normalization detection signal is at logic "0" level, it selects and outputs signal delivered to one input terminal (terminal labeled 0), and in the case where normalization detection signal is at logic "1" level, it selects and outputs signal delivered to the other input terminal (terminal labeled 1).

In the case where the normalization detection signal is at logic "1" level, processing carried out in the metric normalization circuits 501~50n shown in FIG. 13 correspond to implementation of subtraction of $2^{s-2}$ from respective state metrics.

As stated above, in this embodiment, in the normalization circuit 23 for carrying out normalization of state metrics, there is employed a configuration adapted for carrying out normalization of all state metrics by inverting of Most Significant Bit (MSB) or subtraction of value determined in advance on the basis of whether or not only one state metric is set value determined in advance or more. Accordingly, Viterbi decoding unit 20 small in the circuit scale and operative at a high speed can be realized.

Particularly, in the case where, with respect to the normalization detecting circuit 31 and the normalization processing circuit 32 in the normalization circuit 23, the first configuration example of the normalization detecting circuit 41 shown in FIG. 7 and the configuration example of the normalization processing circuit 42 shown in FIGS. 11 and 12 are used in combination, the normalization detecting circuit 41 can be constituted by one logical product circuit, and the normalization processing circuit 42 can be constituted by respectively providing select circuits 51 and inverting circuits 52 by stages corresponding to the number of states. Accordingly, circuit very small in the circuit scale and operative at a high speed can be realized.

Figure 14:
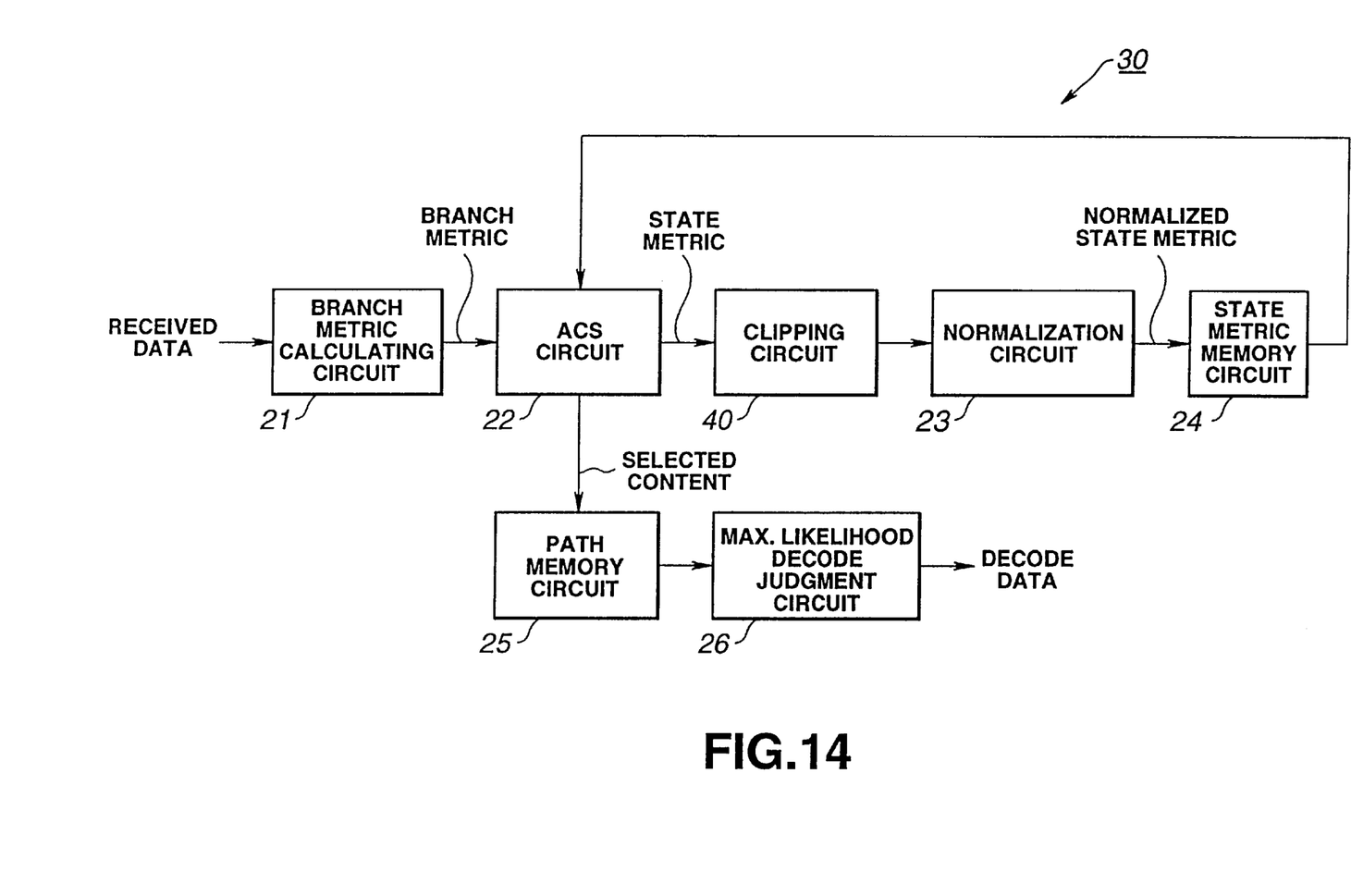
FIG. 14 is a block diagram showing another example of the configuration of Viterbi decoding apparatus according to this invention.

FIG. 14 is a block diagram of another Viterbi decoding apparatus (unit) 30 according to this invention.

The Viterbi decoding unit 30 shown in FIG. 14 is of a structure in which a clipping circuit 40 is provided at the preceding stage of the normalization circuit 23 in the above-described Viterbi decoding unit 20. In this Viterbi decoding unit 30, since components except for the clipping circuit 40 are the same as those of the above-described Viterbi decoding unit 20, the same reference numerals are respectively attached to the same components and their detailed explanation is omitted. In the case where value W for carrying out subtraction by the normalization processing is set to an extremely small value, there occurs the possibility that overflow of state metric may take place before normalization is carried out by the normalization circuit 23. In such a case, clipping circuit 40 for carrying out clipping of state metric is provided at the preceding stage of the normalization circuit 23, thereby making it possible to suppress bad influence by overflow of state metric taking place before normalization. As a result, the normalization technique which has been explained in this embodiment can be applied also to the case where subtraction value W is set to small value.

As explained above, in accordance with this invention, the normalization circuit and the normalization processing are realized by combination of two simple processing of processing for judging whether or not only one state metric is set value determined in advance or more and normalization processing by inverting of Most Significant Bit (MSB) or subtraction of value determined in advance. Accordingly, it is possible to realize a Viterbi decoding apparatus small in the circuit scale and operative at a high speed as compared to the conventional configuration by combination of minimum value detection processing and subtraction of minimum value.

What is claimed is:

1. A Viterbi decoding apparatus comprising:
    a branch metric calculating circuit for calculating a branch metric on the basis of an input signal;
    an ACS circuit for selecting a path of high likelihood on the basis of the branch metric calculated at the branch metric calculating circuit to output a state metric;
    a path memory circuit for storing the selected path information obtained by the ACS circuit;
    a normalization circuit for normalizing the state metric outputted from the ACS circuit;
    a state metric memory circuit for storing the state metric normalized at the normalization circuit; and
    a maximum likelihood decoding judgment circuit for selecting a maximum likelihood path on the basis of memory content of the path memory circuit,
    wherein the normalization circuit carries out normalization processing of all state metrics on the basis of whether or not a state metric outputted from the ACS circuit is at least a set value determined in advance.

2. The Viterbi decoding apparatus as set forth in claim 1, wherein the normalization circuit carries out judgment as to whether or not the state metric is at least the set value determined in advance in carrying out normalization processing of all state metrics by taking a logical product of a Most Significant Bit and several bits of lower order with respect to the Most Significant Bit of the state metric.

3. The Viterbi decoding apparatus as set forth in claim 2, wherein the normalization circuit carries out the normalization processing by inverting the Most Significant Bits of all state metrics.

4. The Viterbi decoding apparatus as set forth in claim 2, wherein the normalization circuit carries out the normalization processing by subtracting a value determined in advance from all state metrics.

5. The Viterbi decoding apparatus as set forth in claim 1, wherein the normalization circuit carries out judgment as to whether or not the state metric is at least the set value determined in advance in carrying out the normalization processing by taking a logical sum of a Most Significant Bit and several bits of lower order with respect to the Most Significant Bit of the state metric.

6. The Viterbi decoding apparatus as set forth in claim 5 wherein the normalization circuit carries out the normalization processing by subtracting a value determined in advance from all state metrics.

7. A Viterbi decoding method comprising the steps of:

calculating a branch metric on the basis of an input signal;

carrying out ACS processing to select a path of high likelihood on the basis of the branch metric to output a state metric;

storing selected path information obtained by the ACS processing;

carrying out normalization processing of all state metrics on the basis of whether or not a state metric outputted by the ACS processing is at least a set value determined in advance;

storing the normalized state metrics; and carrying out maximum likelihood decoding judgment processing for selecting a maximum likelihood path on the basis of the stored selected path information.

8. The Viterbi decoding method as set forth in claim 7, wherein judgment as to whether or not the state metric is at least the set value determined in advance in carrying out the normalization processing is carried out by taking a logical product of a Most Significant Bit and several bits of lower order with respect to the Most Significant Bit of the state metric.

9. The Viterbi decoding method as set forth in claim 8, wherein the normalization processing is carried out by inverting the Most Significant Bits of all state metrics.

10. The Viterbi method as set forth in claim 8, wherein the normalization processing is carried out by subtracting a value determined in advance from all state metrics.

11. The Viterbi decoding method as set forth in claim 7, wherein judgment as to whether or not the state metric is at least the set value determined in advance in carrying out the normalization processing is carried out by taking a logical sum of a Most Significant Bit and several bits of lower order with respect to the Most Significant Bit of the state metric.

12. The Viterbi decoding method as set forth in claim 11, wherein the normalization processing is carried out by subtracting a value determined in advance from all state metrics.

* * * * *